United States Patent
Verma et al.

(10) Patent No.: US 11,721,757 B2
(45) Date of Patent: Aug. 8, 2023

(54) SEMICONDUCTOR DEVICE

(71) Applicant: UNITED MICROELECTRONICS CORP., Hsin-Chu (TW)

(72) Inventors: Purakh Raj Verma, Singapore (SG); Chia-Huei Lin, Hsinchu (TW); Kuo-Yuh Yang, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/391,048

(22) Filed: Aug. 2, 2021

(65) Prior Publication Data

US 2021/0359131 A1 Nov. 18, 2021

Related U.S. Application Data

(63) Continuation of application No. 15/892,373, filed on Feb. 8, 2018, now Pat. No. 11,114,562.

(30) Foreign Application Priority Data

Jan. 9, 2018 (CN) .......................... 201810018449.9

(51) Int. Cl.
*H01L 29/06* (2006.01)
*H01L 29/10* (2006.01)
(Continued)

(52) U.S. Cl.
CPC ...... *H01L 29/7824* (2013.01); *H01L 29/0696* (2013.01); *H01L 29/1095* (2013.01);
(Continued)

(58) Field of Classification Search
CPC ............. H01L 29/7824; H01L 29/0696; H01L 29/1095; H01L 29/4238; H01L 29/66681;
(Continued)

(56) References Cited

U.S. PATENT DOCUMENTS 6,617,656 B2  9/2003  Lee et al.
7,235,451 B2  6/2007  Hao et al.
(Continued)

FOREIGN PATENT DOCUMENTS

CN     1909233 A    2/2007
CN   102593170 A    7/2012
(Continued)

OTHER PUBLICATIONS

Bon et al., "High Voltage Devices Added to a 0.13um High Resistivity Thin SOI CMOS Process for Mixed Analog-RF Circuits," 2005, IEEE International SOI Conference, pp. 171-173. (Year: 2005).*

(Continued)

*Primary Examiner* — Benjamin Tzu-Hung Liu
(74) *Attorney, Agent, or Firm* — Winston Hsu

(57) ABSTRACT

A LDMOS device includes a semiconductor layer on an insulation layer and a ring shape gate on the semiconductor layer. The ring shape gate includes a first gate portion, a second gate portion, and two third gate portions connecting the first gate portion and the second gate portion. The semiconductor device further includes a first drain region and a second drain region formed in the semiconductor layer at two sides of the ring shape gate, a plurality of source regions formed in the semiconductor layer surrounded by the ring shape gate, a plurality of body contact regions formed in the semiconductor layer and arranged between the source regions, and a first body implant region and a second body implant region formed in the semiconductor layer, respectively underlying part of the first gate portion and part of the second gate portion, and being connected by the body contact regions.

11 Claims, 3 Drawing Sheets

(51) Int. Cl.

| | | |
|---|---|---|
| *H01L 29/423* | (2006.01) | |
| *H01L 29/66* | (2006.01) | |
| *H01L 29/786* | (2006.01) | |
| *H01L 21/266* | (2006.01) | |
| *H01L 21/285* | (2006.01) | |
| *H01L 29/78* | (2006.01) | |

(52) U.S. Cl.
CPC .... *H01L 29/4238* (2013.01); *H01L 29/66681* (2013.01); *H01L 29/78624* (2013.01); *H01L 21/266* (2013.01); *H01L 21/28518* (2013.01); *H01L 29/665* (2013.01)

(58) Field of Classification Search
CPC ............. H01L 29/78624; H01L 21/266; H01L 21/28518; H01L 29/665; H01L 29/7802
See application file for complete search history.

(56) References Cited

U.S. PATENT DOCUMENTS

| | | | |
|---|---|---|---|
| 9,165,918 B1 | 10/2015 | Yang | |
| 9,337,310 B2 | 5/2016 | Letavic | |
| 9,831,338 B1 | 11/2017 | Lin | |
| 2008/0303088 A1* | 12/2008 | Pang | ................. H01L 29/66689 438/237 |
| 2009/0242982 A1 | 10/2009 | Cai | |
| 2010/0127326 A1 | 5/2010 | Lee | |
| 2010/0301388 A1 | 12/2010 | Lin | |
| 2012/0037986 A1 | 2/2012 | Kim | |
| 2014/0015006 A1* | 1/2014 | Kubo | ................... H01L 29/7816 438/135 |
| 2014/0332901 A1 | 11/2014 | Yang | |
| 2014/0361366 A1 | 12/2014 | Cai | |
| 2015/0116029 A1 | 4/2015 | Litty | |
| 2015/0214365 A1 | 7/2015 | Xie | |
| 2016/0284841 A1 | 9/2016 | Min | |
| 2016/0343853 A1 | 11/2016 | Toh et al. | |
| 2017/0194490 A1* | 7/2017 | Li | ..................... H01L 29/42384 |

FOREIGN PATENT DOCUMENTS

| | | |
|---|---|---|
| TW | 447121 | 7/2001 |
| WO | 99/40629 A1 | 8/1999 |

OTHER PUBLICATIONS

Lachenal et al., "Reliability Investigation of NLDEMOS in 0.13um SOI CMOS Technology," May 2006, International Conference of Microelectronics, pp. 14-17. (Year: 2006).*

Bon et al., "High Voltage Devices Added to a 0.13um High Resistivity Thin SOI CMOS Process for Mixed Analog-RF Circuits," 2005, IEEE International SOI Conference, pp. 171-173. (Year: 2005) (Year: 2005).*

O. Bon et al., "High Voltage Devices Added to a 0.13um High Resistivity Thin SOI CMOS Process for Mixed Analog-RF Circuits", 2005 IEEEE International SOI Conference, pp. 171-173.

* cited by examiner

SEMICONDUCTOR DEVICE

CROSS REFERENCE TO RELATED APPLICATIONS

This is a continuation application of U.S. application Ser. No. 15/892,373 filed Feb. 8, 2018, and incorporated herein by reference in its entirety.

BACKGROUND OF THE INVENTION

1. Field of the Invention

The invention relates to a semiconductor device, and more particularly to a lateral-diffusion metal-oxide semiconductor (LDMOS) device.

2. Description of the Prior Art

In current semiconductor processing, controllers, memories, circuits of low-voltage operation and power devices of high-voltage operation are largely integrated into a single chip to achieve a single-chip system. The power device, such as vertical double-diffusion metal-oxide-semiconductor (VDMOS), insulated gate bipolar transistor (IGBT) and lateral diffusion MOS (LDMOS), is employed to increase power switching efficiency and decrease the loss of energy resources. It is often required that the switching transistors withstand high breakdown voltages and operate at a low on-resistance.

However in today's high voltage devices, the gate pattern of the LDMOS typically has a T-shape or H-shape cross-section which usually has higher resistance under the gate structure. Hence how to improve the design of current high voltage device so that the device would have higher performance has become an important task in this field.

SUMMARY OF THE INVENTION

According to an embodiment of the present invention, a lateral-diffusion metal-oxide semiconductor (LDMOS) device includes a semiconductor layer on an insulation layer and a ring shape gate on the semiconductor layer, wherein the ring shape gate comprises a first gate portion and a second gate portion extending along a first direction and arranged in parallel along a second direction, and two third gate portions extending along the second direction to connect the first gate portion and the second gate portion. The semiconductor device further includes a first drain region and a second drain region with a first conductive type formed in the semiconductor layer at two sides of the ring shape gate, a plurality of source regions with the first conductive type formed in the semiconductor layer surrounded by the ring shape gate, a plurality of body contact regions with a second conductive type formed in the semiconductor layer and arranged between the source regions along the first direction, and a first body implant region and a second body implant region with the second conductive type formed in the semiconductor layer, respectively underlying part of the first gate portion and part of the second gate portion along the first direction, and being connected by the body contact regions.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
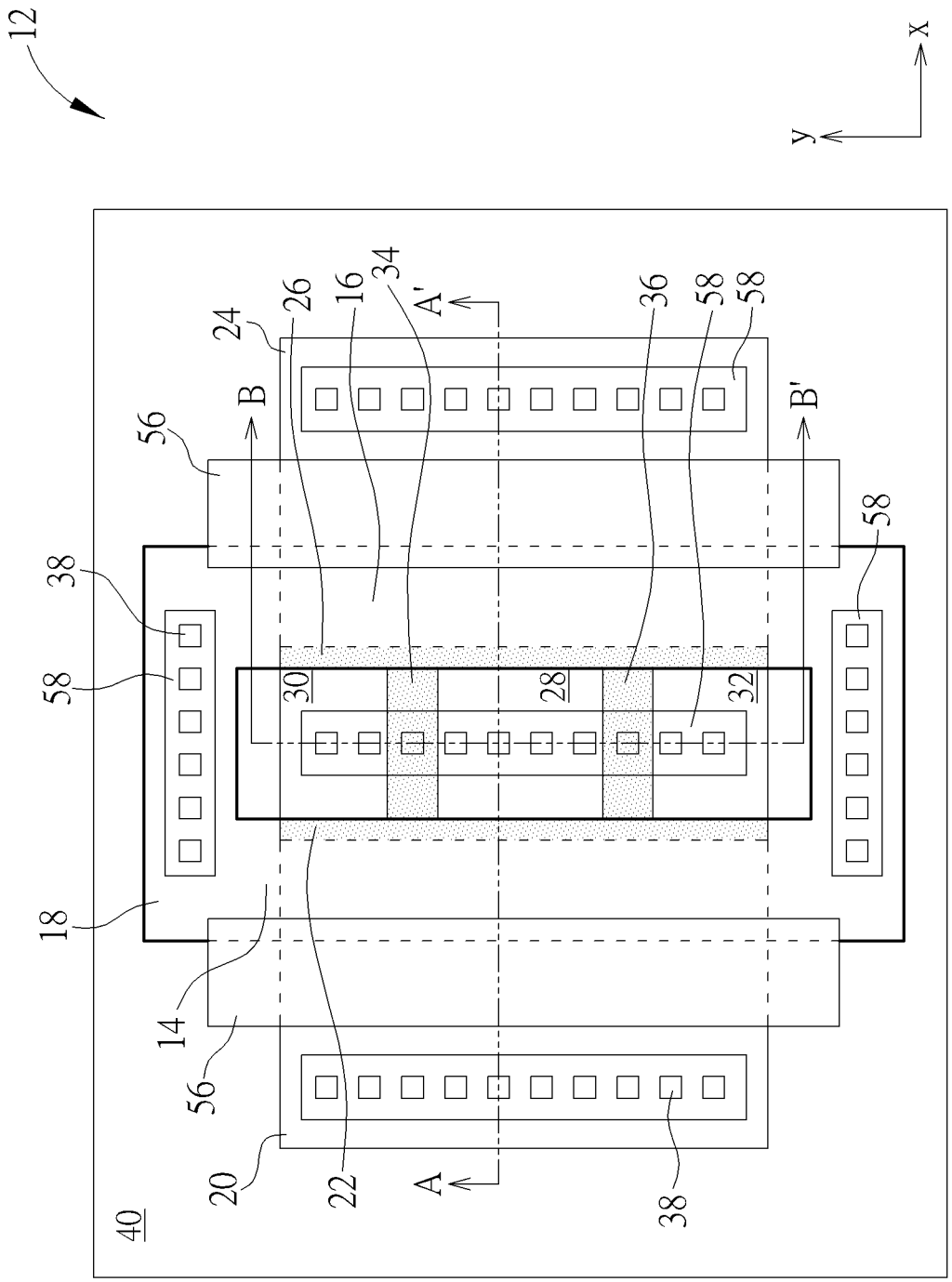
FIG. 1 illustrates a top view of a LDMOS device according to an embodiment of the present invention.
Figure 2:
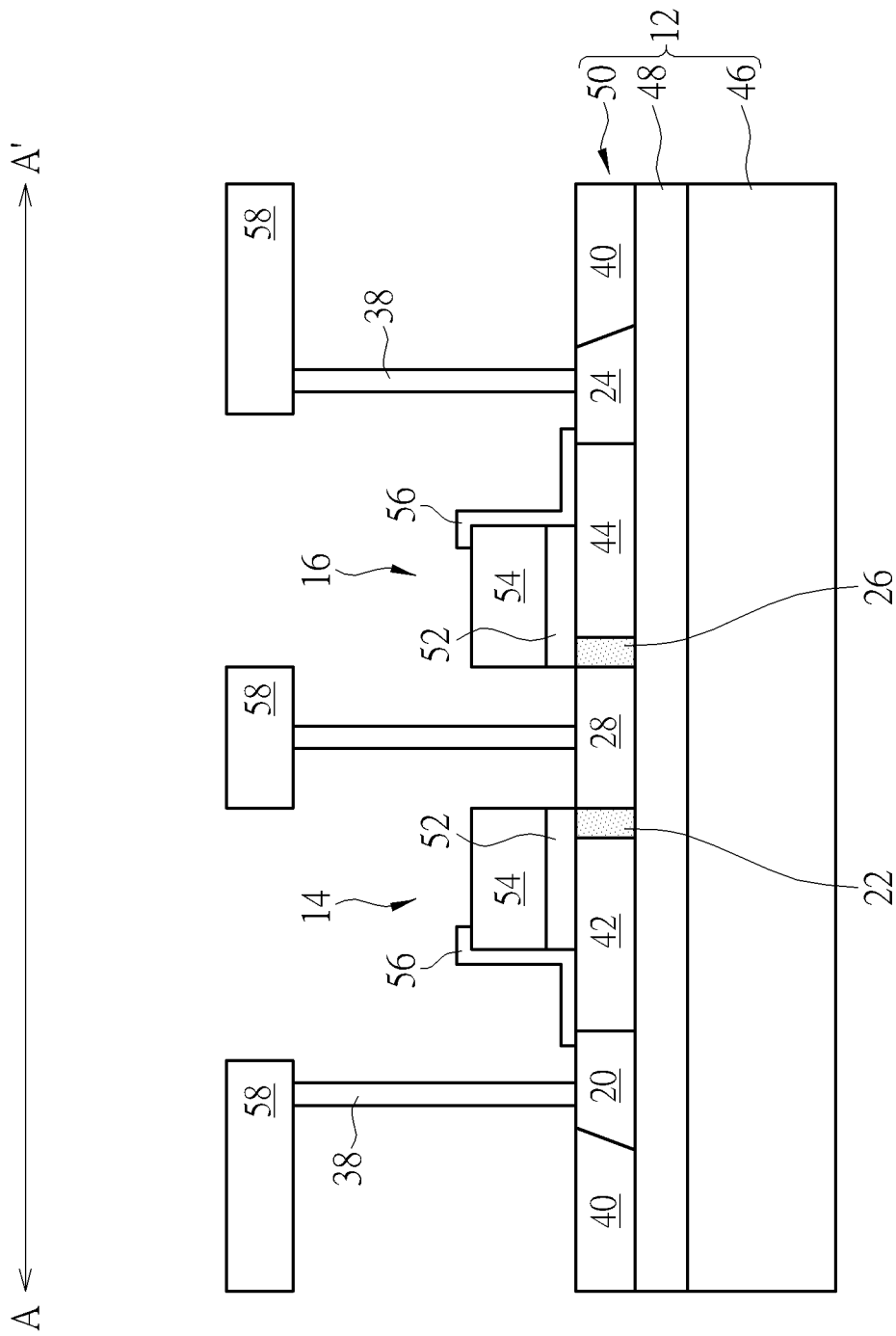
FIG. 2 illustrates a cross-section view of the LDMOS device along the sectional line AA'.
Figure 3:
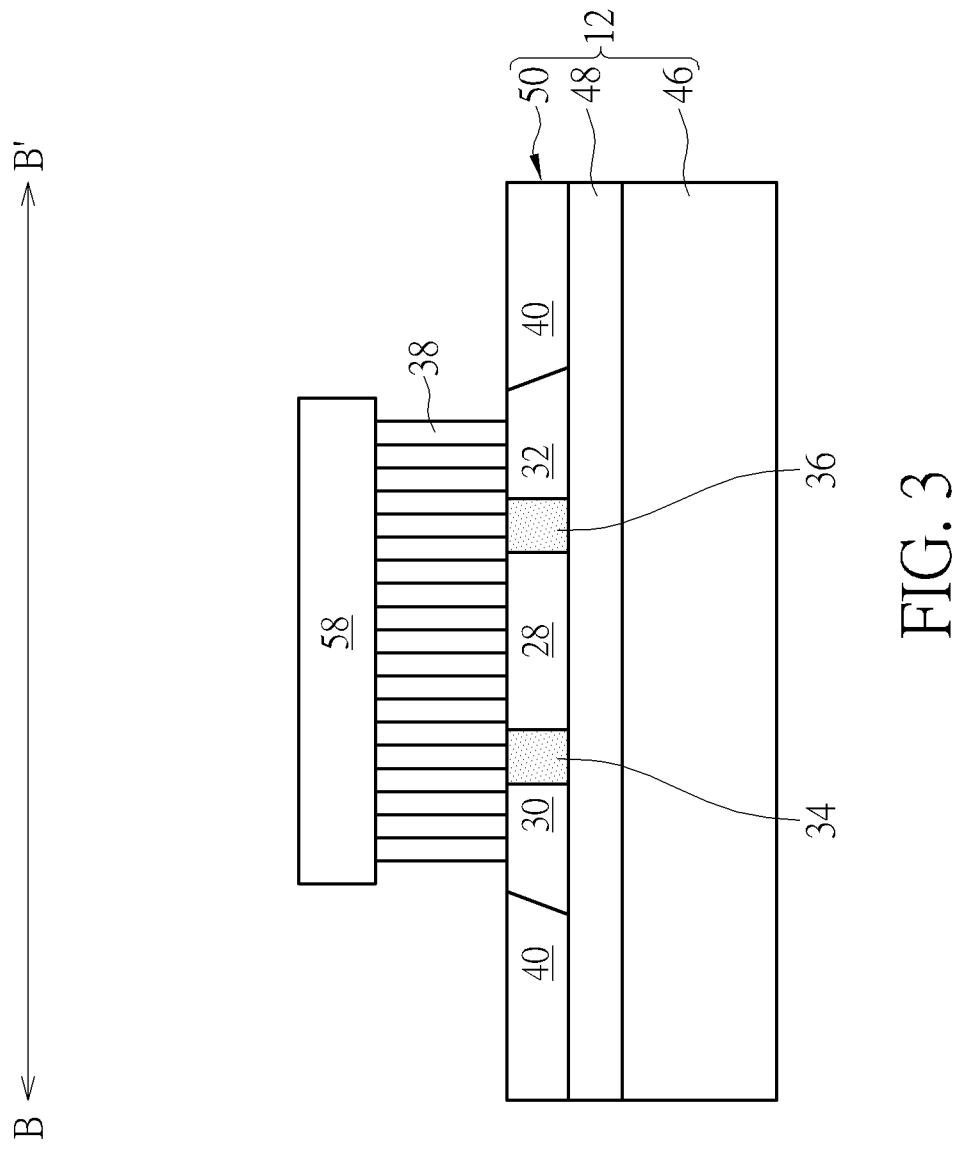
FIG. 3 illustrates a cross-section view of the LDMOS along the sectional line BB'.

Referring to FIGS. 1-3, FIGS. 1-3 illustrate structural views of a LDMOS device according to an embodiment of the present invention, in which FIG. 1 illustrates a top view of the LDMOS device, FIG. 2 illustrates a cross-section view of the LDMOS device along the sectional line AA', and FIG. 3 illustrates a cross-section view of the LDMOS along the sectional line BB'.

As shown in FIG. 1, the semiconductor device includes a first gate structure 14 and a second gate structure 16 extending along a first direction (such as Y-direction) on a substrate 12, a gate pattern 18 extending along a second direction (such as X-direction) to connect the first gate structure 14 and the second gate structure 16, a first drain region 20 extending along the first direction on one side of the first gate structure 14, a first body implant region 22 extending along the first direction and overlapping part of the first gate structure 14, a second drain region 24 extending along the first direction adjacent to one side of the second gate structure 16, and a second body implant region 26 extending along the first direction and overlapping part of the second gate structure 16.

The semiconductor device further includes a first source region 28 disposed on another side of the first gate structure 14 or between the first gate structure 14 and the second gate structure 16, a second source region 30 disposed above the first source region 28, a third source region 32 disposed below the first source region 28, a first body contact region 34 extending along the second direction between the first source region 28 and the second source region 30, a second body contact region 36 extending along the second direction between the first source region 28 and the third source region 32, and a plurality of contact plugs 38 electrically connecting the gate pattern 18, the first drain region 20, the second drain region 24, the first source region 28, the second source region 30, and the third source region 32.

Viewing from a more detailed perspective, an edge of the first body implant region 22 is aligned with an edge of the first gate structure 14, an edge of the second body implant region 26 is aligned with an edge of the second gate structure 16, and the left sidewall and right sidewall of the first body contact region 34 overlap part of the first gate structure 14 and part of the second gate structure 16 respectively, align with the edges of the first body implant region 22 and the second body implant region 26, and separate the first source region 28 and the second source region 30 so that the two regions 28, 30 not overlapping each other. Similarly, the left sidewall and right sidewall of the second body contact region 36 overlap part of the first gate structure 14 and part of the second gate structure 16 respectively, align with edges of the first body implant region 22 and second body implant region 26, and separate the first source region 28 and the third source region 32 so that the two regions 28, 32 not overlapping each other.

Referring to FIGS. 2-3, in which FIG. 2 illustrates a cross-section of FIG. 1 along the sectional line AA' and FIG. 3 illustrates a cross-section of FIG. 1 along the sectional line BB'. As shown in FIGS. 2-3, the semiconductor device when viewed from another perspective includes a shallow trench isolation (STI) 40 disposed in the substrate, a first gate structure 14 and second gate structure 16 disposed on the substrate 12 between the STI 40, a first drain region 20 disposed adjacent to one side of the first gate structure 14, a first drift region 42 disposed under part of the first gate structure 14 and part of the salicide block (SAB) 56 and extended to and contacting the first drain region 20, a first source region 28 disposed on another side of the first gate structure 14 or in the substrate 12 between the first gate structure 14 and the second gate structure 16, a first body contact region 22 under part of the first gate structure 14, a second drain region 24 disposed adjacent one side of the second gate structure 16, a second drift region 44 disposed under part of the second gate structure 16 and part of the of the salicide block 56 and extended to and contacting the second drain region 24, and a second body contact region 26 under part of the second gate structure 16.

In this embodiment, the substrate 12 preferably includes a silicon-on-insulator (SOI) substrate, which could further includes a first semiconductor layer 46, an insulating layer 48 disposed on the first semiconductor layer 46, and a second semiconductor layer 50 disposed on the insulating layer 48. Preferably, the first semiconductor layer 46 and the second semiconductor layer 50 could be made of semiconductor material including but not limited to for example silicon, germanium, or silicon germanium (SiGe) and the insulating layer 48 could be made of dielectric material including but not limited to for example silicon oxide.

It should be noted that since the device disclosed in this embodiment pertains to a n-type LDMOS device, elements including the first drain region 20, the first drift region 42, the first source region 28, the second drain region 24, and the second drift region 44 preferably include a first conductive type such as n-type, whereas the elements including the first body contact region 34, the second body contact region 36, the first body implant region 22, and the second body implant region 26 preferably include a second conductive type such as p-type. Nevertheless, according to other embodiments of the present invention it would also be desirable to employ the same architecture disclosed in this embodiment to a p-type LDMOS device and in such instance the first drain region 20, the first drift region 42, the first source region 28, the second drain region 24, and the second drift region 44 would preferably include a first conductive type such as p-type while elements including the first body contact region 34, the second body contact region 36, the first body implant region 22, and the second body implant region 26 would include a second conductive type such as n-type, which is also within the scope of the present invention.

In this embodiment, the first source region 28, the first drain region 20, and the second drain region 24 preferably share same concentration, the first drift region 42 and the second drift region 44 preferably have same concentration, and the concentration of the first source region 28, the first drain region 20, and the second drain region 24 is preferably greater than the concentration of the first drift region 42 and the second drift region 44. The first body contact region 34 and the second body contact region 36 preferably have same concentration, the first body implant region 22 and the second body implant region 26 preferably have same concentration, and the concentration of the first body contact region 34 and second body contact region 36 is preferably greater than the concentration of the first body implant region 22 and the second body implant region 26.

Preferably, the STI 40 and all of the doped regions including the first drain region 20 on the left to the second drain region 24 on the right are all disposed within the second semiconductor layer 50 of the substrate 12 and the bottom surfaces of the STI 40 and all of the doped regions are even with the bottom surface of the second semiconductor layer 50. Even though an edge of the first body implant region 22 is aligned with an edge of the first gate structure 14 as shown in FIG. 2 while an edge of the second body implant region 26 is also aligned with an edge of the second gate structure 16, according to other embodiments of the present invention, the edge of each of the body implant regions could also be not aligned to the edge of each of the gate structures.

For instance, the right edge or right sidewall of the first body implant region 22 could be not aligned to an edge of the first gate structure 14 such that both the left and right edges of the first body implant region 22 could be directly under the first gate structure 14 at the same time, or the right edge of the first body implant region 22 could be slightly extended to the right and passing the edge of the first gate structure 14. Similarly, the left or left sidewall of the second body implant region 26 could be not aligned to an edge of the second gate structure 16 such that both the left and right edges of the second body implant region 26 could be directly under the second gate structure 16 at the same time, or the left edge of the second body implant region 26 could be slightly extended to the left and over the edge of the second gate structure 16, which are all within the scope of the present invention.

In this embodiment, the formation of each of the gate structures including the first gate structure 14, the second gate structure 16, and the gate pattern 18 connecting the first gate structure 14 and the second gate structure 16 could be accomplished by a gate first process, a high-k first approach from gate last process, or a high-k last approach from gate last process. Since this embodiment pertains to a gate first approach, a gate dielectric layer 52 or interfacial layer, a gate material layer 54 made of polysilicon, and a selective hard mask could be formed sequentially on the substrate 12, and a photo-etching process is then conducted by using a patterned resist (not shown) as mask to remove part of the gate material layer 54 and part of the gate dielectric layer 52 through single or multiple etching processes. After stripping the patterned resist, a first gate structure 14 and a second gate structure 16 each composed of a patterned gate dielectric layer 52 and a patterned material layer 54 are formed on the substrate 12. Preferably, the gate pattern 18 is disposed on the STI 40 and the first gate structure 14, the second gate structure 16, and the gate pattern 18 connecting the two gate structures 14, 16 are formed in unity and constitute a ring-shaped pattern altogether.

In this embodiment, it would also be desirable to use the salicide block (SAB) 56, the first gate structure 14, and the second gate structure 16 to define the position of silicide layers and the aforementioned source regions and drain regions. For instance, it would be desirable to first form the SAB 56 on part of the top surface and sidewalls of the first gate structure 14 and the second gate structure 16 and the surface of the substrate 12, conduct an ion implant process by using the SAB 56 as mask to form the first drain region 20, the first source region 28, and the second drain region 24 in the second semiconductor layer 50, and then conduct a salicide process by using the same SAB 56 as mask to form silicides on surfaces not covered by the SAB 56, including surfaces on the first drain region 20, the first gate structure 14, the first source region 28, the second gate structure 16, and the second drain region 24.

Preferably, the semiconductor device further includes an interlayer dielectric (ILD) layer (not shown) disposed on the substrate 12 to cover the first gate structure 14 and the second gate structure 16 and a plurality of contact plugs 38 disposed in the ILD layer to electrically connect the first drain region 20, the first source region 28, and the second drain region 24. The formation of the contact plugs 38 could be accomplished by first forming an ILD layer (not shown) on the substrate 12, and then conduct a pattern transfer or photo-etching process by using a patterned mask (not shown) as mask to remove part of the ILD layer adjacent to the first gate structure 14 and the second gate structure 16 for forming contact holes (not shown) exposing the first drain region 20, the first source region 28, and the second drain region 24 underneath. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs 38 electrically connecting the first drain region 20, the first source region 28, and the second drain region 24. Next, a metal interconnective process is conducted to form inter-metal dielectric (IMD) layer (not shown) on the ILD layer and metal interconnections 58 connected to each of the contact plugs 38.

Overall, the present invention provides a novel LDMOS device by first disposing the LDMOS device on a SOI substrate, in which doped regions or body implant regions having conductive type opposite from the source region and drain region are disposed under part of the gate structures and the body implant regions are also disposed extending along the same direction as the gate structures. Preferably, the present invention could use the presence of the body implant regions to increase finger widths of the transistor and lower gate to body capacitance thereby improving the performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A lateral-diffusion metal-oxide semiconductor (LDMOS) device, comprising:
    a semiconductor layer on an insulation layer;
    a ring shape gate on the semiconductor layer, comprising:
        a first gate portion and a second gate portion extending along a first direction and arranged in parallel along a second direction; and
        two third gate portions extending along the second direction to connect the first gate portion and the second gate portion;
    a first drain region and a second drain region with a first conductive type formed in the semiconductor layer at two sides of the ring shape gate;
    a plurality of source regions with the first conductive type formed in the semiconductor layer surrounded by the ring shape gate;
    a plurality of body contact regions with a second conductive type formed in the semiconductor layer and arranged between the source regions along the first direction;
    a first body implant region and a second body implant region with the second conductive type formed in the semiconductor layer, respectively underlying part of the first gate portion and part of the second gate portion along the first direction, and being connected by the body contact regions; and
    a plurality of contact plugs disposed on each of the two third gate portions of the ring shape gate to electrically connect the ring shape gate to two metal interconnections.

2. The LDMOS device according to claim 1, wherein an edge of the first drain region, an edge of the second drain region, an edge of the first body implant region, an edge of the second body implant region, and an edge of one of the source regions are flush with each other along the second direction.

3. The LDMOS device according to claim 2, wherein the edge of the first drain region, the edge of the second drain region, the edge of the first body implant region, the edge of the second body implant region, and the edge of one of the source regions are bordered and directly contacted by a shallow trench isolation.

4. The LDMOS device according to claim 1, wherein the first body implant region, the second body implant region, and the body contact regions collectively form a plurality of H shapes.

5. The LDMOS device according to claim 1, wherein an edge of the first body implant region is aligned with an edge of the first gate portion.

6. The LDMOS device according to claim 1, wherein an edge of the second body implant region is aligned with an edge of the second gate portion.

7. The LDMOS device according to claim 1, further comprising:
    a first drift region with the first conductive type formed in the semiconductor layer between the first drain region and the first gate portion and underlying part of the first gate portion;
    a second drift region with the first conductive type formed in the semiconductor layer between the second drain region and the second gate portion and underlying part of the second gate portion;
    a first salicide block on the semiconductor layer and completely covering the first drift region; and
    a second salicide block on the semiconductor layer and completely covering the second drift region.

8. The LDMOS device according to claim 1, wherein a concentration of the body contact regions is greater than a concentration of the first body implant region and the second body implant region.

9. The LDMOS device according to claim 1, wherein the first conductive type is n-type, the second conductive type is p-type.

10. The LDMOS device according to claim 1, wherein bottom surfaces of the first drain region, the second drain region, the source regions, the body contact regions, the first body implant region, and the second body implant region are coplanar and directly contact a surface of the insulation layer.

11. The LDMOS device according to claim 1, further comprising a plurality of contact plugs disposed on the semiconductor layer to electrically connect the source regions and body contact regions to a same metal interconnection.

* * * * *